United States Patent [19]

Rypkema

[11] 4,411,019

[45] Oct. 18, 1983

[54] AGC SYSTEM FOR TELEVISION RECEIVERS

[75] Inventor: Jouke N. Rypkema, Lombard, Ill.

[73] Assignee: Zenith Radio Corporation, Glenview, Ill.

[21] Appl. No.: 342,277

[22] Filed: Jan. 25, 1982

[51] Int. Cl.³ .............................................. H04B 1/16
[52] U.S. Cl. .................................. 455/180; 455/200;
455/241; 455/242; 455/251
[58] Field of Search ............... 455/188, 190, 200, 180,
455/241-243, 251; 358/179

[56] References Cited

U.S. PATENT DOCUMENTS

| 3,242,433 | 3/1966 | Carlson et al. | 455/200 |
| 3,548,315 | 12/1970 | Lehmann et al. | 455/190 |
| 4,162,452 | 7/1979 | Ash | 455/188 |

FOREIGN PATENT DOCUMENTS 503638  4/1939  United Kingdom ................ 455/242

Primary Examiner—Jin F. Ng

[57] ABSTRACT

An AGC system is described for setting a plurality of different AGC delay points for various channels or bands of channels in a television receiver. In one embodiment, the system includes an AGC control which develops a gain control signal for the UHF and VHF tuners, and an AGC delay circuit which determines the point at which the gain control signal becomes effective to initiate gain reduction in the tuners. Preferably, the delay circuit causes the AGC control to establish a first AGC delay point, corresponding to a given level of incoming signal strength, at which the gain control signal causes the VHF tuner to begin gain reduction, and establishes a different delay point corresponding to a relatively higher level of incoming signal strength at which the gain control signal causes the UHF tuner to begin gain reduction. In another embodiment, a separate AGC delay point is set for channel 6 to provide a more desirable delay point for other channels in the VHF band. The latter embodiment can also provide a customized AGC delay for each channel in the UHF and VHF bands.

5 Claims, 5 Drawing Figures

AGC SYSTEM FOR TELEVISION RECEIVERS

BACKGROUND OF THE INVENTION

This invention is generally directed to improvements in television receivers. It is particularly directed to an AGC (Automatic Gain Control) system for selectively controlling the gains of UHF and VHF tuners.

Conventional television receivers include a VHF tuner for reception of 12 television channels in the very high frequency band and a UHF tuner for reception of additional channels in the ultra high frequency band. The outputs of these tuners are converted to an IF (intermediate frequency) signal by means of a mixer whose output is applied to one or more stages of IF amplication. A detector normally converts the amplified IF signals to baseband, and an AGC control senses the strength of the detector's output. Any deviation from nominal in the detector's output results in the AGC control developing a control signal which is used to correct the gain of the IF amplifier or the appropriate tuner.

In addition to holding the detector's output constant, one of the objectives of an AGC system is to obtain an undistorted, relatively noise free signal at the output of the detector. As is well known, the noise which appears at this point in the receiver depends on the strength of the signal received by the tuner, the characteristics of the circuitry following the tuner, and the noise figure and other characteristics of the tuner. Thus, to obtain a relatively clean signal at the detector's output, the AGC action should at least take into account the noise contributions associated with the tuner.

To obtain a detected signal which is relatively noise free, it is common practice to design the AGC control so that gain reduction is applied first to the IF amplifiers. At a certain higher strength of the incoming television signal, the gain of the IF amplifiers is held constant and the gain of the tuner's RF amplifier is reduced so as to avoid overloading the mixer. The cross-over point at which gain reduction is switched from the IF amplifier to the tuner is sometimes referred to as the AGC delay point.

The choice of an AGC delay point is usually determined by the performance characteristics of the VHF tuner, and that point is normally set by a potentiometer, a voltage divider, or the like. Once the delay point has been selected, it is used as the starting point for gain reduction of both the VHF tuner as well as the UHF tuner. This selection criteria can result in a detected signal which is too noisy when the UHF tuner is operative, primarily because UHF tuners have inherently poorer signal-to-noise characteristics than VHF tuners. In addition, the AGC delay point is sometimes compromised to avoid so-called "channel 6" beats from the mixer during VHF reception. This compromise causes the tuner's gain reduction to begin even sooner, and further deteriorates the noise condition of detected UHF signals. Hence, even under relatively strong signal conditions, a UHF television image may appear somewhat noisy.

The prior art has suggested using separate AGC voltages to control the gain reduction of the VHF and UHF tuners. See U.S. Pat. No. 3,688,198 for example.

Other suggestions from prior art include varying the point where the AGC becomes effective in an attempt to provide a constant signal-to-noise ratio, irrespective of the strength of the incoming signal. This proposal appears in U.S. Pat. No. 3,609,234.

The problem with both suggested approaches is that the gain reduction of the UHF and VHF tuners still begins at about the same point. Hence, the characteristics of the UHF tuner which render it inherently noisier are still not fully compensated for.

OBJECTS OF THE INVENTION

It is a general object of the invention to provide an improved AGC system for a television receiver.

It is a more specific object of the invention to provide an AGC system which compensates for the inherently noisier characteristics of a UHF tuner so as to provide a more noise-free signal from the detector.

It is another object of the invention to provide an AGC system in which selection of AGC delay points is not compromised by the necessity to inhibit channel 6 beats.

BRIEF DESCRIPTION OF THE FIGURES

The objects stated above and other objects of the invention are set forth more particularly in the following detailed description of the accompanying drawings, of which.

DESCRIPTION OF THE PREFERRED EMBODIMENT

As stated previously, one of the primary drawbacks with conventional AGC systems is that they employ the same AGC delay point for the VHF and UHF tuners. Thus, relatively noise-free VHF images may be produced under strong signal conditions, but relatively noisier UHF images are produced under the same signal strength conditions. To overcome this problem, one embodiment of the invention recognizes the inherently noisier characteristics of UHF tuners and compensates for them by providing two separate AGC delay points, one for the UHF tuner and one for the VHF tuner. The AGC delay point of the UHF tuner is selected to occur at a relatively high strength of an incoming television signal, whereas the AGC delay point of the VHF tuner is selected to occur at a relatively lower strength of an incoming television signal. By appropriate selection of these AGC delay points, relatively noise-free images under strong signal conditions may be produced irrespective of whether UHF or VHF television signals are being received.

Figure 1:
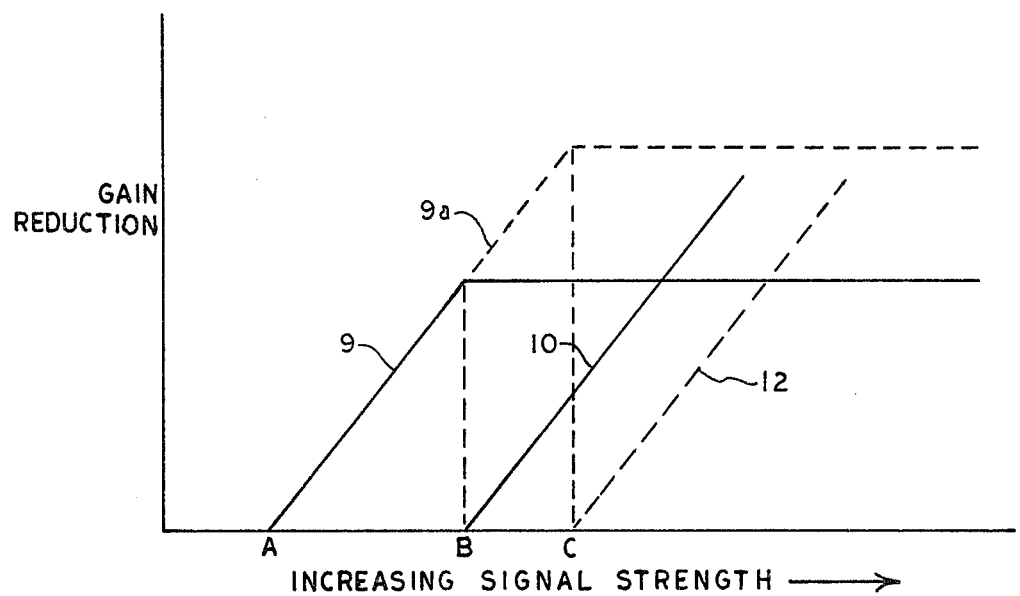
FIG. 1 is a plot of signal strength versus gain reduction of an IF amplifier and a tuner's RF amplifiers in a television receiver embodying an AGC control according to the invention.

To graphically illustrate this aspect of the invention, reference is made to FIG. 1. As shown by the solid line 9 in this figure, the gain reduction of a conventional IF amplifier is zero at very low signal strengths, and then begins increasing at signal strength A. At this point A, the output of the detector reaches its nominal value. When the strength of the incoming signal reaches point B, RF gain reduction is initiated to avoid overloading the mixer. This point B corresponds to the conventional AGC delay point for both the VHF tuner and the UHF tuner.

In the present AGC control system, the RF amplifier in the VHF tuner may have an AGC delay corresponding to point B and a gain reduction as indicated by the line 10. The RF amplifier in the UHF tuner, however, exhibits a gain reduction as indicated by the dashed line 12. That is, the UHF tuner has an AGC delay point which occurs at a greater signal strength (point C) in order to enhance the signal-to-noise ratio of a detected UHF signal. When operating in this mode, the IF amplifier exhibits gain reduction as shown by line 9 up to point B and continues its gain reduction as shown by line 9a until point C is reached.

Figure 2:
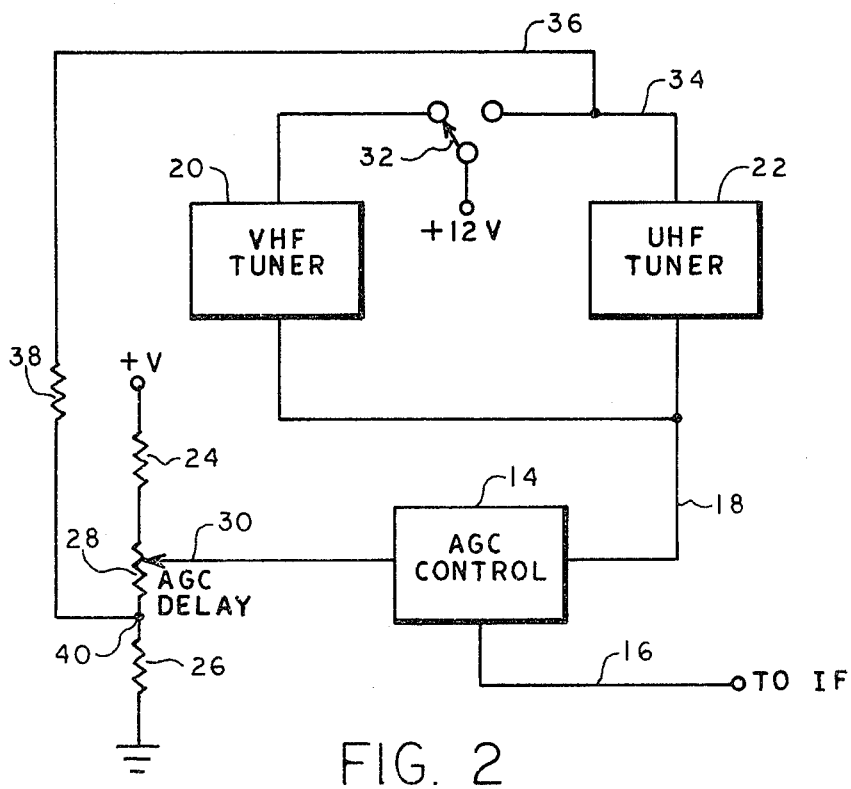
FIG. 2 is a block diagram which illustrates an AGC control system according to the invention.

Referring now to FIG. 2, one embodiment of the present AGC system includes a conventional AGC control block 14. This control senses the output of a video detector (not shown) and develops a gain control signal on lead 16 for controlling the gain of an IF amplifier. Another control signal is developed on lead 18 to control the gain of RF amplifiers in a VHF tuner 20 and in a UHF tuner 22.

To set the AGC delay points of the tuners, fixed resistors 24 and 26 and a potentiometer 28 are included. These resistors are serially connected between ground and a voltage source (+V) so that a delay reference voltage may be developed on the wiper arm 30 of the potentiometer.

The AGC control 14 is responsive to the value of the delay reference voltage for varying the control voltages on leads 16 and 18 so that gain reduction occurs at the delay point set by the potentiometer 28. Any suitable AGC control may be used for this purpose, such as the one incorporated in SYNC-AGC board No. 9-876 in the 25JC492 television chassis manufactured by Zenith Radio Corporation.

As is conventional, a user may select either the VHF tuner or the UHF tuner for operation, depending on the channel which the user desires to receive. Part of the means by which the user selects one of the tuners is functionally illustrated as a switch 32 which may be part of an electrical or mechanical channel selection control. One end of the switch 32 is coupled to a tuner operating voltage (+12 V), and its other end is movable to couple the operating voltage to either the VHF tuner or to the UHF tuner. When the switch 32 is in its illustrated position, a 12 volt operating potential is coupled to the VHF tuner to render it operative, and the UHF tuner remains inoperative. When the switch is thrown to the opposite position, the UHF tuner is enabled and the VHF tuner is turned off.

With the VHF tuner enabled, the AGC control and the AGC delay setting operates as previously described. That is, the delay point of the VHF tuner is set by the potentiometer 28. In this condition, the UHF tuner does not respond to the control signal on lead 18.

To enable a different AGC delay to be applied to the UHF tuner, a lead 34 which carries operating voltage to this tuner is coupled via another lead 36 and a resistor 38 to the junction (node 40) between the resistor 26 and the potentiometer 28. Thus, when the switch 32 is moved to enable the UHF tuner, the potential at node 40 is raised. Consequently, the delay reference voltage on the wiper arm 30 is also raised. In response to this change in the delay reference voltage, the AGC control 14 modifies the control voltage on lead 18 so as to establish a different AGC delay for the UHF tuner.

When the switch 32 is moved to disable the UHF tuner, the original delay voltage once again appears on the wiper arm 30 because the lead 36 becomes decoupled from the tuner's operating voltage. Hence, each tuner automatically operates with its own AGC delay.

The amount of delay provided for the tuners depends on various tuner parameters and other aspects of the television receiver. It is preferred, however, that the delay be selected so that gain reduction of the UHF tuner is initiated at a higher signal strength than that at which the VHF tuner's gain reduction begins. The system of FIG. 2 operates in this mode.

Figure 3:
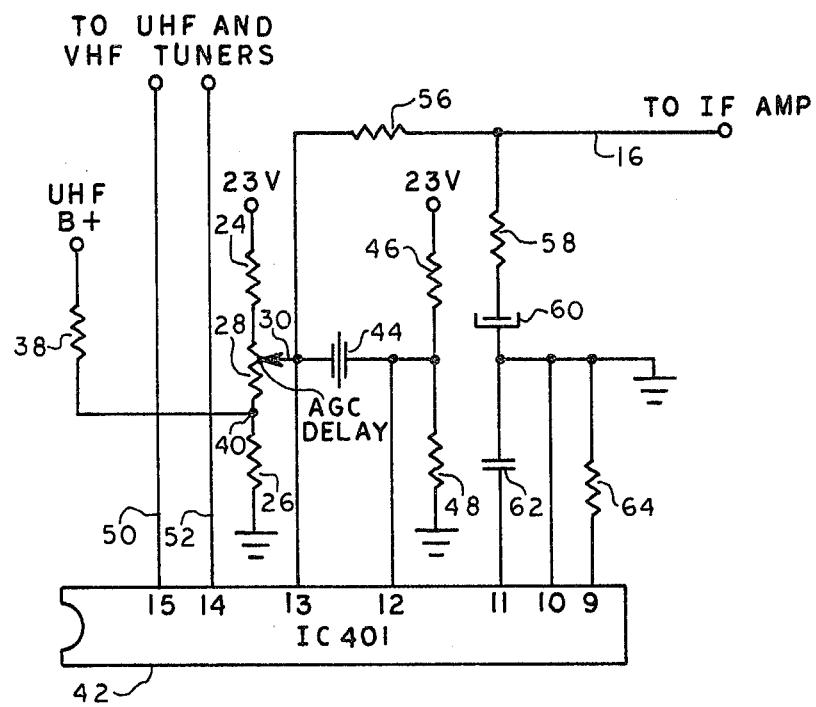
FIG. 3 is a schematic diagram illustrating one embodiment of the AGC control system shown in FIG. 2.

Referring now to FIG. 3, a circuit diagram is shown to illustrate how the system of FIG. 2 may be implemented. The AGC control (and other circuitry) is contained with an integrated circuit chip 42 identified as IC401. This chip is part of the SYNC-AGC board in the previously mentioned 25JC492 chassis. For clarity, only those chip pins relating to AGC are shown.

Pin 13 of the illustrated chip is coupled to the wiper arm of the AGC delay setting potentiometer 28. Resistors 24 and 26 are serially coupled with this potentiometer between ground and a 23 volt supply voltage. The wiper arm is also coupled via a capacitor 44 to pin 12 of the chip and to a voltage divider comprising resistors 46 and 48. Resistor 38 couples the UHF tuner's operating voltage to the node 40 when that tuner is selected by the user.

AGC control voltage is applied to the UHF and VHF tuners via leads 50 and 52 which are coupled to pins 15 and 14, respectively, of the chip 42. The IF amplifier receives its AGC control voltage from pin 13 via a resistor 56 and lead 16. Also coupled to the lead 16 is a resistor 58 which is coupled to ground by a capacitor 60. Another capacitor 62 couples pin 11 to ground. Pin 9 is grounded through a resistor 64 and pin 10 may be coupled directly to ground. With this arrangement, the circuitry of FIG. 3 operates as described above for the block diagram of FIG. 2.

Figure 4:
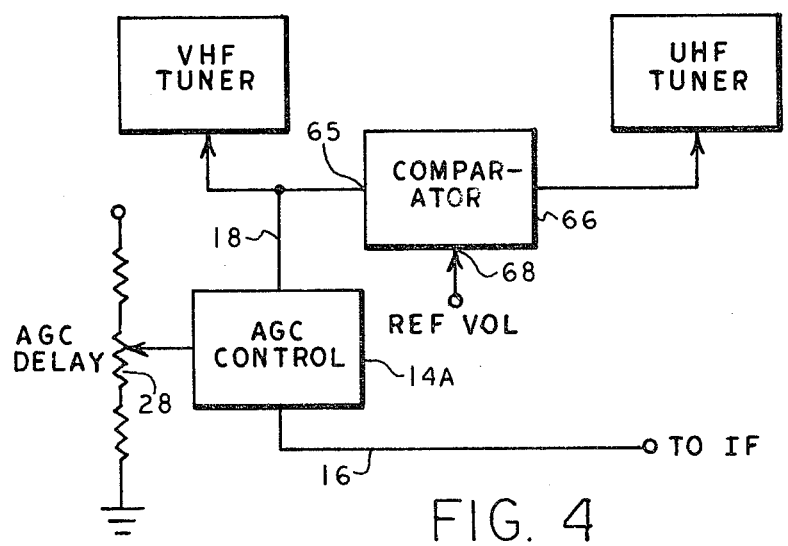
FIG. 4 is a block diagram of an alternate AGC control system according to the invention.

The UHF tuner's AGC delay may be provided in a number of ways, although the implementation shown in FIG. 1 is preferred because of its low cost. An alternate implementation which does not require access to the UHF tuner's operating voltage is shown in FIG. 4, to which reference is now made.

In this embodiment, a conventional AGC control 14A, which may be functionally similar to the AGC control 14, is coupled to the wiper arm of the potentiometer 28 and responds to its setting as previously described. Thus, an AGC control voltage is coupled to the IF amplifier via the lead 16 and an AGC control voltage is coupled to the VHF tuner via the lead 18.

To provide a separate delay for the UHF tuner, the lead 18 is coupled to one input 65 of a conventional comparator 66. The comparator's other input 68 receives a d.c. reference voltage whose value is representative of the UHF tuner's delay point. With this arrangement, the comparator outputs the AGC control voltage to the UHF tuner to initiate its gain reduction when the reference voltage at input 68 bears a selected amplitude relationship to the AGC control voltage at input 65. For example, the comparator may output the AGC control voltage when that voltage is equal in amplitude to the reference voltage. Thus, the embodiment of FIG. 4 is functionally similar to the embodiment of FIG. 2 in that the UHF and VHF tuners are each provided with separate and independently adjustable AGC delay points.

In the embodiments described above, the AGC delay point for the VHF tuner may be set to reduce the effects of the channel 6 beat. Although this may compromise the quality of detected VHF signals somewhat under strong signal conditions, the detected signals are acceptable for most purposes.

Figure 5:
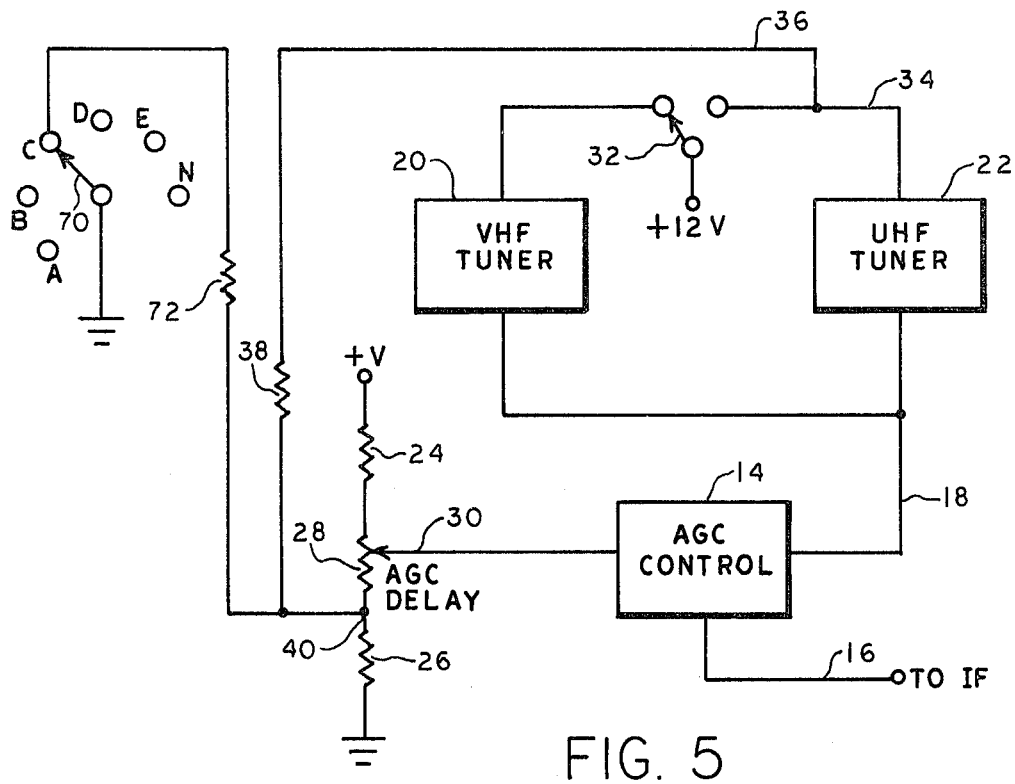
FIG. 5 is a block diagram of another AGC control system according to the invention.

To improve the quality of detected VHF signals under strong signal conditions, the AGC system of FIG. 2 is modified as shown in FIG. 5. The embodiment shown in the latter figure provides a separate AGC delay point for channel 6 so that other channels in the VHF band may have a delay point that occurs at higher signal strengths.

The problem presented by channel 6 at relatively large signal strengths is that the picture carrier and the sound carrier may combine with the receivers' local oscillator signal to develop a 42 megahertz component. That component can then generate a 170 kilohertz beat in the detected chroma.

To eliminate this beat frequency component, or at least reduce it without affecting the quality of the detected signals from other VHF channels, the embodiment of FIG. 5 modifies the AGC reference delay voltage in response to selection of channel 6. for this purpose, a switch 70 is included which may be part of a mechanical switch assembly or electronic channel address system for user selection of channels. Associated with the switch 70 are contacts A-N. Each of these contacts corresponds to a different channel. When channel 6 is selected, the node 40 is coupled via a resistor 72 and the switch 70 to ground, thereby lowering the voltage at node 40. Hence, the AGC delay is lowered so that gain reduction of the VHF tuner occurs at a relatively low signal strength to avoid the generation of a channel 6 beat. With this arrangement, positioning the switch 70 at any of the other contacts removes the effect of resistor 72 so that the AGC operation of the UHF tuner and the VHF tuner (except for channel 6) occurs as previously described. Thus, the VHF tuner's delay point may be selected to occur at a higher signal strength than the delay point for channel 6, and the UHF tuner's delay point may be selected to occur at even a higher signal strength.

It is also contemplated that the AGC delay may be customized for channels other than, or in addition to, channel 6. For example, each of the contacts A-N may be coupled to the node 40 via its own resistor so that the delay points of N VHF channels may be independently selected by appropriate selection of N different resistors. Of course, the switch 70 may be modified to include multiple poles for simultaneously switching in different values for resistor 38 and resistors coupled to contacts A through N. In addition, another switch similar to the switch 70 may be provided for the UHF tuner to select N different UHF channels. In this case, the switch 32 can be eliminated.

The theory exemplified by the embodiment of FIG. 5 may also be applied to tuners which are controlled by a microprocessor. The microprocessor may be easily programmed to output a different digital AGC command in response to selection of each channel. Those commands can be supplied to the AGC control via a conventional digital-to-analog convertor for customizing the AGC delay point for each UHF and VHF channel. The microprocessor commands may take into account the nominal design characteristics of a particular tuner, including its noise figure, and any significant characteristics of the tuner and the circuitry following the tuner.

It will be evident from the foregoing description that the various embodiments of the invention each establish a plurality of different AGC delay points at which a gain control signal becomes effective to reduce the gain of the tuners. In this manner, various channels or bands of channels are given their own AGC delay points to provide higher quality detected signals, particularly under strong signal conditions.

Although the invention has been described in terms of preferred structure, it will be obvious to those skilled in the art that many alterations and modifications may be made without departing from the invention. Accordingly, it is intended that all such alterations and modifications be considered as within the spirit and scope of the invention defined by the appended claims.

What is claimed is:

1. In a television receiver having gain controllable UHF and VHF tuners for respective tuning of channels in the UHF and VHF television bands and a gain controllable IF amplifier, an AGC system therefor, comprising:
    an AGC control for developing a first gain control signal for the IF amplifier and a second gain control signal for the tuners;
    means for coupling the first gain control signal to the IF amplifier;
    means for coupling the second gain control signal to the tuners; and
    AGC delay means coupled to the AGC control for establishing at least three different AGC delay points at which the second gain control signal becomes effective to reduce the gain of the UHF and VHF tuners in response to the respective selection of the UHF tuner, the VHF tuner and a selected channel within one of the UHF or VHF television bands.

2. An AGC system as set forth in claim 1 wherein said selected channel comprises channel 6 and wherein the AGC delay means establishes, for the VHF tuner, a first AGC delay point corresponding to a given strength of an incoming television signal, for the UHF tuner, a second AGC delay point corresponding to a relatively higher strength of an incoming television signal and, for channel 6, a third AGC delay point corresponding to a relatively lower strength of an incoming television signal.

3. An AGC system as set forth in claim 2 wherein the UHF and VHF tuners are selectable by switching an operating voltage from one tuner to the other tuner, wherein the AGC delay means couples to the AGC control a DC voltage corresponding to the first AGC delay point and a reduced DC voltage corresponding to the third AGC delay point in response to selection of channel 6, and wherein the AGC delay means receives at least part of the operating voltage switched to the UHF tuner for coupling to the AGC control an increased DC voltage corresponding to the third AGC delay point.

4. An AGC system as set forth in claim 2 wherein said AGC delay means includes:
    a network for coupling to the AGC control a DC signal representative of the first AGC delay point;
    a reference signal source having a value representative of the point at which the UHF tuner is intended to begin gain reduction; and means for comparing the second AGC control signal to the reference signal and for initiating gain reduction in the UHF tuner when the reference voltage bears a selected amplitude relationship to the first AGC control voltage.

5. In a television receiver having gain controllable UHF and VHF tuners and a gain controllable IF amplifier, an AGC system therefor, comprising:
  means for selectively switching an operating voltage from the VHF tuner to the UHF tuner;
  an AGC control for developing a first gain control signal for the IF amplifier and a second gain control signal for the tuners, said AGC control being responsive to a received delay signal for controlling the point at which the second gain control signal becomes effective;
  means for coupling the first gain control signal to the IF amplifier;
  means for coupling the second gain control signal to the tuners; and
  AGC delay means coupled to the AGC control, responsive to selection of the VHF tuner for coupling to the AGC control a delay signal for establishing a first AGC delay point for the VHF tuner, and responsive to selection of channel 6 for establishing a second AGC delay point for the VHF tuner and receiving at least part of the tuner operating voltage when that voltage is applied to the UHF tuner for modifying the value of the delay signal such that a third AGC delay point is established for the UHF tuner, said first AGC delay point being selected to correspond to a given strength of an incoming television signal, the second AGC delay point being selected to correspond to a relatively lower strength of incoming television signal and the third AGC delay point being selected to correspond to a relatively higher strength of an incoming television signal.

* * * * *